US008750412B2

(12) United States Patent
Lin et al.

(10) Patent No.: US 8,750,412 B2
(45) Date of Patent: Jun. 10, 2014

(54) DATA PROCESSING SYSTEM AND DATA PROCESSING METHOD

(75) Inventors: Qiang Lin, Beijing (CN); Jun Tian, Beijing (CN)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/446,297

(22) Filed: Apr. 13, 2012

(65) Prior Publication Data

US 2012/0263255 A1 Oct. 18, 2012

(30) Foreign Application Priority Data

Apr. 14, 2011 (CN) .......................... 2011 1 0101391

(51) Int. Cl.
*H04K 1/02* (2006.01)
(52) U.S. Cl.
USPC ............................................ 375/296; 455/69
(58) Field of Classification Search
USPC ......... 341/50, 65, 67, 107; 375/242, 260, 295
See application file for complete search history.

(56) References Cited

U.S. PATENT DOCUMENTS

| 2007/0264963 A1 | 11/2007 | Srinivasan et al. | |
| 2010/0310000 A1* | 12/2010 | Ko et al. | 375/260 |
| 2011/0045783 A1* | 2/2011 | Luschi et al. | 455/69 |

FOREIGN PATENT DOCUMENTS

CN 101511099 8/2009

OTHER PUBLICATIONS

LV Li-juan, Li Jing; "The Application of Hoffman Arithmetic in Reducing the Energy Consuming in WSN System" dated 1994-2012, China Academic Journal Electronic Publishing House; English Abstract; [URL http://www.cnki.net ].

* cited by examiner

*Primary Examiner* — Leon-Viet Nguyen
(74) *Attorney, Agent, or Firm* — Myers Wolin, LLC

(57) ABSTRACT

The present invention provides a source node device and a destination node in a data processing system, a data processing system, and a decoding method. The source node device includes: an encoding unit, configured to conduct an encoding processing on collected original data according to a codebook including an encoded numerical value and a sending interval corresponding to the original data so as to encode the original data into encoded data having a corresponding encoded numerical value included in the codebook, and to determine a sending interval corresponding to the encoded data included in the codebook. According to the present invention, sending intervals of different encoded data are determined and distinguished based on sending intervals corresponding to the encoded data included in the codebook, which provides a better performance on channel load, channel access collisions, energy efficiency, consumed resources or lifetime of the data processing system.

16 Claims, 10 Drawing Sheets

DATA PROCESSING SYSTEM AND DATA PROCESSING METHOD

CROSS REFERENCE TO RELATED APPLICATIONS

The present application claims foreign priority to Chinese Patent Application No. 201110101391.2, filed on Apr. 14, 2011, the contents of which are herein wholly incorporated by reference.

FIELD OF THE INVENTION

The present invention relates to data processing technologies, and in particular to a data processing system, a source node device and a destination node in a data processing system, and a corresponding method of data processing.

BACKGROUND OF THE INVENTION

Existing data processing systems such as various networks have the problems of large network load, low energy efficiency, etc. Generally, in order to solve these problems, improving the network protocol stack is one of the common methods to increase energy efficiency.

For example, in a Wireless Sensor Network (WSN), a large number of low-complexity sensor nodes form the wireless network in an autonomous manner. However, in many application scenarios, the WSN nodes are unapproachable and it is difficult to replace their batteries. Hence, there are problems such as to increase energy efficiency of a WSN and/or to extend its lifetime.

SUMMARY OF THE INVENTION

A brief summary of the present invention is provided below, to enable a basic understanding of some aspects of the present invention. It is noted that the summary is not a comprehensive description of the present invention. The summary is not intended to determine a key or important part of the present invention, nor is it intended to define the scope of the present invention. The sole purpose of the summary is to give some concepts in a simplified form, which may serve as a preface to the detailed descriptions that follow.

At least one of the objectives of the present invention is to provide a source node device in a data processing system, which can overcome at least some of the drawbacks and disadvantages as discussed above, and achieve at least one of the advantages of: effectively reduced channel load, less channel access collisions, increased energy efficiency of the data processing system, saved resources and extended lifetime of the data processing system.

In order to achieve the objective above, according to an embodiment of the present invention, it is provided a source node device in a data processing system, including: an encoding unit, configured to conduct an encoding processing on collected original data according to a codebook including an encoded numerical value and a sending interval which are corresponding to the original data so as to encode the original data into encoded data having a corresponding encoded numerical value included in the codebook, and to determine a sending interval corresponding to the encoded data included in the codebook.

In order to achieve the objective above, according to another embodiment of the present invention, it is provided a destination node device in a data processing system, including: a decoding unit, configured to conduct a decoding processing on encoded data from a source node device in the data processing system this time according to a receiving interval or a sending interval between the encoded data from the source node device this time and encoded data from the source node device last time based on a codebook including an encoded numerical value and a sending interval which are corresponding to original data, so as to decode the encoded data of this time into original data corresponding to the sending interval and the encoded numerical value included in the codebook, wherein the encoded numerical value and the sending interval included in the codebook are related to the encoded data and the receiving interval, respectively.

In order to achieve the objective above, according to yet another embodiment of the present invention, it is provided a data processing system including the source node device as described above and the destination node device as described above, which makes original data be encoded into encoded data at the source node device and transmitted to the destination node device, and the destination node device conduct decoding processing on the received encoded data to obtain the original data.

According to the embodiments of the present invention, sending intervals of different encoded data are determined and distinguished based on sending intervals corresponding to the encoded data included in the codebook, and at least one of the following advantages can be achieved: effectively reduced channel load, less channel access collisions, increased energy efficiency of the data processing system, saved resources and extended lifetime of the data processing system.

These and other advantages of the present invention will become more apparent from the detailed descriptions of the preferred embodiments of the present invention in conjunction of the accompanying drawings.

BRIEF DESCRIPTION OF THE DRAWINGS

A better understanding of the present invention is enabled by the following description when taken in conjunction with the accompanying drawings. In the accompanying drawings, the same or like reference numerals represent the same or like components. The accompanying drawings, together with the following description, are included in the specification and form a part of the specification, which illustrate the preferred embodiments of the present invention and explain the principle and advantages of the present invention by way of example.

It will be appreciated by those skilled in the art that the components presented in the accompanying drawings are for the sole purpose of simplicity and clarity, and are not necessarily drawn to scale. For example, in order to facilitate understanding of the embodiment of the present invention, some of the components may be enlarged as compared with other components.

EMBODIMENTS OF THE INVENTION

Exemplary embodiments of the present invention will be described in detail in conjunction with the accompanying drawings hereinafter. For the sake of clarity and simplicity, not all the features of a practical embodiment are described in the specification. However, it will be appreciated that numerous embodiment-specific determinations have to be made in the developing of any practical embodiments, in order to achieve a specific objective by the developer, e.g., to comply with those restrains that are associated with a system or a service, which may vary depending on the specific embodiment. In addition, it will also be appreciated that although the development may be complex and time-consuming, it is a routine task for those skilled in the art benefiting from the present disclosure.

It is further noted that in order not to unnecessarily obscure the substance of the present invention, only the device structures and/or processing steps closely related to the technical solution of the present invention are described in the accompanying drawings and the specification; representations and descriptions of those components and processing that are not closely related to the present invention or known by those skilled in the art are omitted.

It is described below a source node device in a data processing system according to a first embodiment of the present invention (not shown in the figures). The source node device includes: an encoding unit, configured to conduct an encoding processing on collected original data according to a codebook including an encoded numerical value and a sending interval which are corresponding to the original data so as to encode the original data into encoded data having a corresponding encoded numerical value included in the codebook, and to determine a sending interval corresponding to the encoded data included in the codebook. As can be seen, the codebook according to the embodiment has a two-dimensional structure including an encoded numerical value and a sending interval which are corresponding to the original data.

The source node device in a data processing system according to the first embodiment determines and distinguishes sending intervals of different encoded data based on sending intervals corresponding to the encoded data included in the codebook, thereby achieving at least one of the advantages of: effectively reduced channel load, less channel access collisions, increased energy efficiency of the data processing system, saved resources and extended lifetime of the data processing system.

Figure 1:
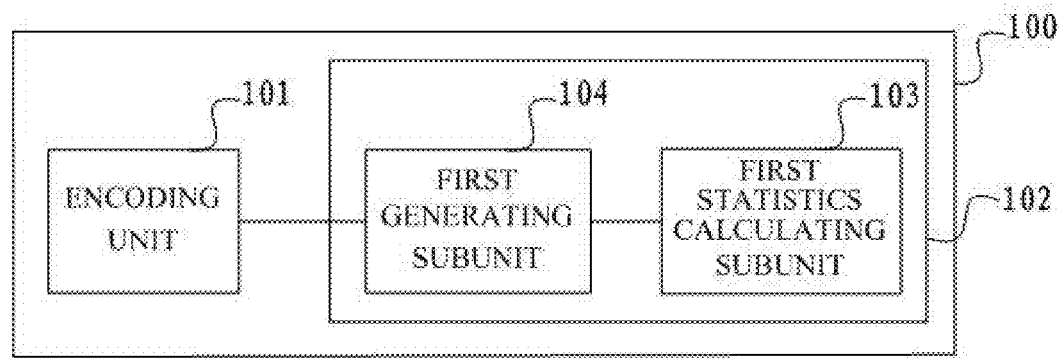
FIG. 1 illustrates a schematic diagram of a source node device in a data processing system according to a second embodiment of the invention.

FIG. 1 illustrates a schematic diagram of a source node device 100 in a data processing system according to a second embodiment of the invention.

The source node device 100 includes an encoding unit 101 and a codebook generating unit 102 for generating the codebook in advance.

The encoding unit 101 is configured to conduct an encoding processing on collected original data according to a codebook including a encoded numerical value and a sending interval which are corresponding to the original data so as to encode the original data into encoded data having a corresponding encoded numerical value included in the codebook, and to determine a sending interval corresponding to the encoded data included in the codebook.

The codebook generating unit 102 includes a first statistics calculating subunit 103 and a first generating subunit 104. The first statistics calculating subunit 103 is configured to conduct statistics calculating on original data collected in a predetermined time window in a mode of representing a global statistics calculating result using local statistics calculating information. The first generating subunit 104 is configured to generate the codebook according to the statistics calculating result of the statistics calculating subunit. As can be seen from the above, the codebook according to the embodiment has a two-dimensional structure including an encoded numerical value and a sending interval which are corresponding to the original data.

The source node device in a data processing system according to the second embodiment determines and distinguishes sending intervals of different encoded data based on sending intervals corresponding to the encoded data included in the codebook, thereby achieving at least one of the advantages of: effectively reduced channel load, less channel access collisions, increased energy efficiency of the data processing system, saved resources and extended lifetime of the data processing system. Particularly, the source node device in a data processing system according to the second embodiment conducts statistics calculating in a mode of representing a global statistics calculating result using local statistics calculating information, and generates the codebook having a two-dimensional structure according to the statistics calculating result, which is particularly applicable to those systems in which collected data has the property of autocorrelation over time, including but not limited to WSNs.

Moreover, the source node device in a data processing system according to the second embodiment conducts statistics calculating on original data collected in a predetermined time window in a mode of representing a global statistics calculating result using local statistics calculating information, and generates the codebook according to the statistics calculating result; hence, the source node device of the embodiment is more applicable to those networks in which transmitted data has the property of autocorrelation over time, e.g., WSNs, so that the autocorrelation over time can be used to generate the codebook from statistics calculating.

In an example, the mode of representing a global statistics calculating result using local statistics calculating information may be but is not limited to a Monte Carlo statistical method.

Moreover, as an example, the first statistics calculating subunit 103 may be configured to divide the predetermined first time window into a plurality of time sub-windows and conduct statistics calculating on original data collected in each time sub-window respectively to obtain a statistics calculating result for each time sub-window. The first generating subunit 104 may be configured to conduct encoding according to the statistics calculating result of each time sub-window respectively and generate the codebook according to accumulated encoding result for each time sub-window. In this example, segmented statistics calculating and encoding are performed by dividing the time window used into a plurality of time sub-windows, and the codebook is generated according to accumulated encoding results, thereby saving node memory and making it more applicable to those systems with a smaller node memory size, e.g., WSNs.

Moreover, in this example, the first generating subunit 104 may generate the codebook according to a variable-length encoding method, including but not limited to Huffman coding. By variable-length encoding, e.g., by encoding original data whose frequency of appearance is higher into encoded data having a shorter length, and encoding original data whose frequency of appearance is lower into encoded data having a longer length, network load can be reduced, resources can be saved, energy efficiency of the data processing system can be increased, and lifetime of the data processing system can be extended.

As an example, the codebook illustrated below may be generated according to Huffman coding:

$$M = \{m_1, m_2, ..., m_n\} \quad (1)$$

$$m_i = (c_i, p_i) \quad (2)$$

$$c_i = \begin{cases} c_{i,p} & c_{i,p} > b_i + \Delta \\ C(f_i, \Delta, b_i) & b_i - \Delta \leq c_{i,p} \leq b_i + \Delta \\ c_{i,p} & c_{i,p} < b_i - \Delta \end{cases} \quad (3)$$

$$P_i = P(c_i, t_i) \quad (4)$$

where equation (1) represents the structure of the codebook, and $m_1, m_2, \ldots, m_n$ represent elements included in the codebook M.

Equation (2) represents that each of the elements m in the codebook includes a numerical value $c_i$ and a corresponding sending interval $p_i$. As can be seen, the codebook has a two-dimensional structure.

Figure 2:
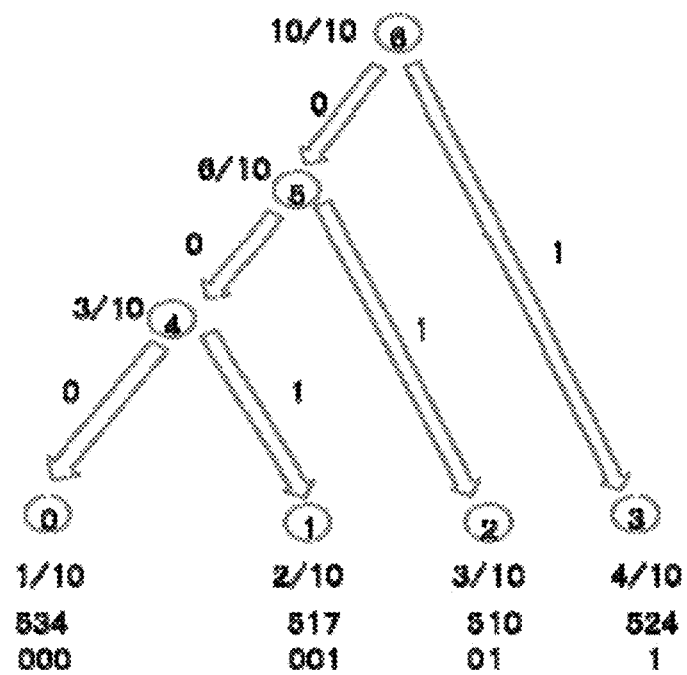
FIG. 2 illustrates a schematic diagram of a variable-length encoding method used by a source node device in a data processing system according to an embodiment of the invention.
Figure 3:
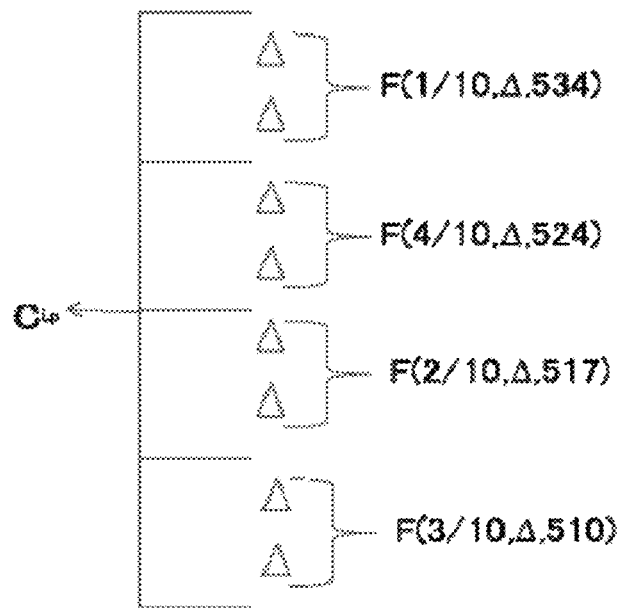
FIG. 3 illustrates another schematic diagram of a variable-length encoding method used by a source node device in a data processing system according to an embodiment of the invention.

Equation (3) represents the formula for calculating the numerical value $c_i$ included in each of the elements m. If, when compared with $b_i$ which is the closest to the numerical value of original data in the encoding range of the codebook, the received original data $c_{i,p}$ is larger than $b_i + \Delta$ or smaller than $b_i - \Delta$ ($\Delta$ being a numerical value representing the degree of precision which is predetermined according to actual application needs), it is determined that the original data is not in the encoding range, and the numerical value corresponding to the original data is set to maintain the numerical value $c_{i,p}$ of the original data; if the received original data $c_{i,p}$ is larger than $b_i - \Delta$ and smaller than $b_i + \Delta$, it is determined that the original data is in the encoding range of the codebook, and the numerical value corresponding to the original data is set to a numerical value $C(f_i, \Delta, b_i)$ related to the frequency of appearance $f_i$ of the original data in the statistics. For example, FIG. 2 and FIG. 3 illustrates an example of variable-length encoding original data falling within an encoding range based on frequencies of appearance of the original data in the statistics. Specifically, original data 524 has a frequency of appearance of 4/10; original data 510 has a frequency of appearance of 3/10; original data 517 has a frequency of appearance of 2/10; and original data 534 has a frequency of appearance of 1/10. Based on their frequencies of appearance, the encoded numerical values corresponding to the original data are 1, 01, 001 and 000, respectively. That is, the higher the frequency of appearance of the original data is, the shorter the length of the corresponding encoded numerical value is; hence, network load can be reduced, and resources can be saved.

Equation (4) represents the formula for calculating the corresponding sending interval $p_i$ included in each of the elements m. As an example, in equation (4), the sending interval $p_i$ is a different multiple of the time reference $t_i$ depending on the encoded numerical value $c_i$ corresponding to $p_i$.

It will be appreciated by those skilled in the art that the equations above (1) to (4) are illustrative but not limitative. Those skilled in the art may choose, flexibly according to actual application needs, the mode of representing a global statistics calculating result using local statistics calculating information that is used by the first statistics calculating subunit 103, and the encoding method that is used by the first generating subunit 104, both of which shall fall within the spirit and scope of protection of the present invention.

In addition, it is noted that although the source node device in a data processing system according to the embodiment is described in conjunction with FIG. 1, those skilled in the art will understand that the schematic diagram of FIG. 1 is for illustrative purposes only and should not be considered as limiting the scope of the present invention. Those skilled in the art may make alternations or modifications to the schematic diagram of FIG. 1 according to actual needs.

Figure 4:
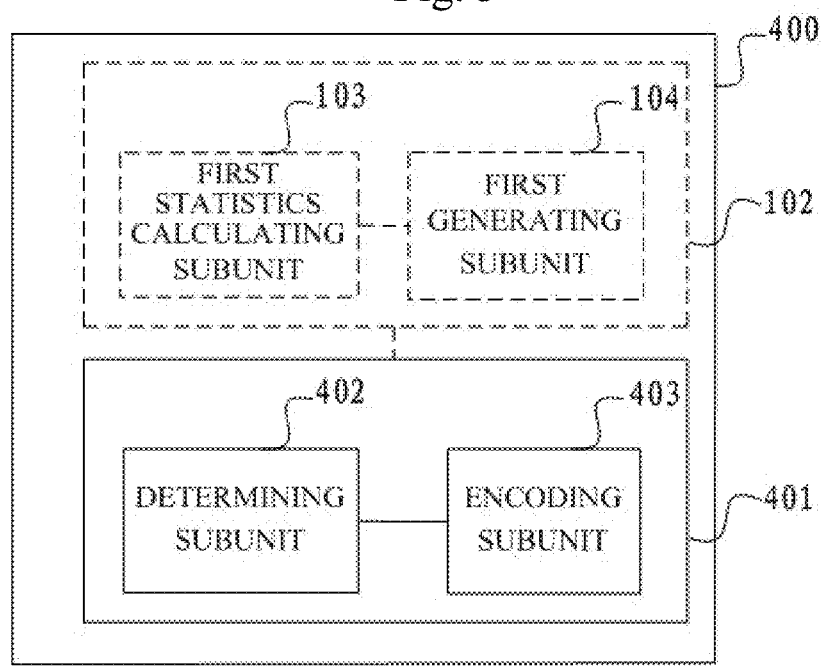
FIG. 4 illustrates a schematic diagram of a source node device in a data processing system according to a third embodiment of the invention.

FIG. 4 illustrates a schematic diagram of a source node device in a data processing system according to a third embodiment of the present invention.

As shown in FIG. 4, the source node device 400 in a data processing system according to the third embodiment of the present invention includes an encoding unit 401, and the encoding unit 401 includes a determining subunit 402 and an encoding subunit 403.

Moreover, as indicated by the dotted box in FIG. 4, according to actual application needs, the source node device 400 in a data processing system according to the third embodiment of the present invention may, optionally, further include a codebook generating unit 102 described in the second embodiment, that is, the encoding unit 401 may perform encoding processing by using a prearranged codebook complying with the properties, e.g., described with FIG. 2 and FIG. 3, which shall fall within the spirit and scope of protection of the present invention.

The determining subunit 402 is configured to determine whether the original data is in an encoding range.

The encoding subunit 403 is configured to: make the encoded data maintain the numerical value of the original data and determine that the encoded data corresponds to a first sending interval included in the codebook in the case that the original data is determined by the determining subunit 402 to be not in the encoding range; and encode the original data into the encoded data having the corresponding encoded numerical value included in the codebook and determine the encoded data corresponds to a second sending interval included in the codebook in the case that the original data is determined by the determining subunit 402 to be in the encoding range.

For example, as shown in FIG. 2, when the numerical value of the original data is 510, it is determined that the original data is in the encoding range; therefore, the original data is encoded into encoded data having a corresponding encoded numerical value (i.e., the encoded numerical value 01 corresponding to the original data 510 in FIG. 2) included in the codebook, and a sending interval corresponding to the encoded data is determined according to equation (4) above.

The source node device 400 in a data processing system according to the third embodiment of the present invention determines and distinguishes sending intervals of different encoded data based on sending intervals corresponding to the encoded data included in the codebook, thereby achieving at least one of the advantages of: effectively reduced channel load, less channel access collisions, increased energy efficiency of the data processing system, saved resources and extended lifetime of the data processing system. Particularly, the source node device in a data processing system according to the third embodiment determines whether the original data is in an encoding range of the codebook by a determining unit and determines the encoded data and the sending interval corresponding to the original data according to the determining result and based on the codebook; hence, the encoding range of the codebook can be set flexibly and suitably according to actual application needs so that the original data that has a high frequency of appearance is included in the codebook and the original data that is not included in the codebook can be processed timely.

In addition, it is noted that although the source node device in a data processing system according to the embodiment is described in conjunction with FIG. 4, those skilled in the art will understand that the schematic diagram of FIG. 4 is for illustrative purposes only and should not be considered as limiting the scope of the present invention. Those skilled in the art may make alternations or modifications to the schematic diagram of FIG. 4 according to actual needs.

Figure 5:
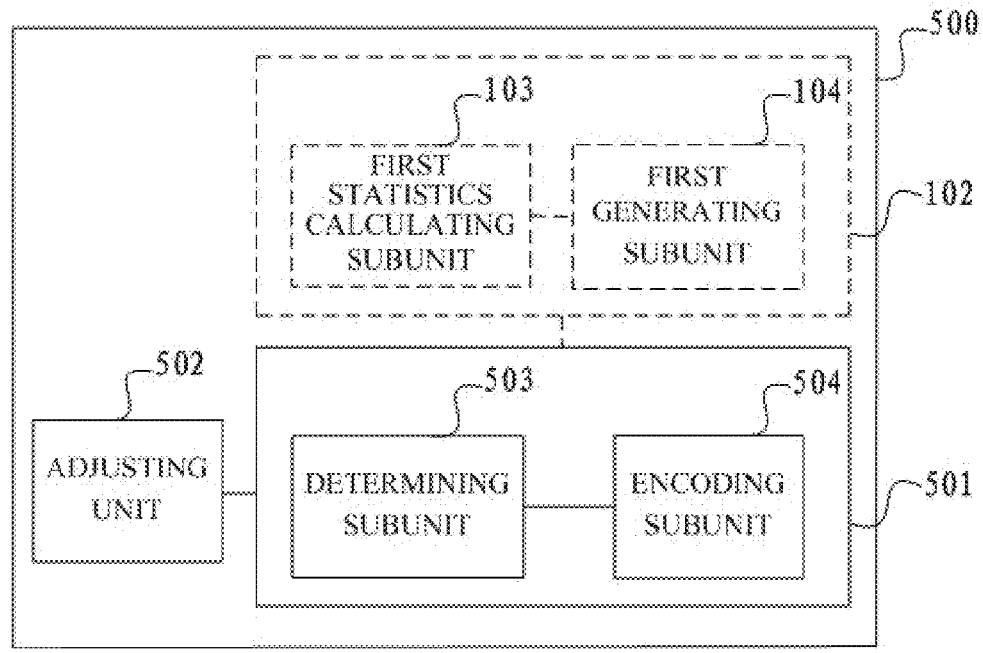
FIG. 5 illustrates a schematic diagram of a source node device in a data processing system according to a fourth embodiment of the invention.

FIG. 5 illustrates a schematic diagram of a source node device in a data processing system according to a fourth embodiment of the invention.

As shown in FIG. 4, the source node device 500 in a data processing system according to the fourth embodiment of the present invention includes an encoding unit 501 and an adjusting unit 502, and the encoding unit 501 includes a determining subunit 503 and an encoding subunit 504.

The determining subunit 503 is configured to determine whether the original data is in an encoding range of the codebook.

The encoding subunit 504 is configured to: make the encoded data maintain the numerical value of the original data and determine that the encoded data corresponds to a first sending interval included in the codebook in the case that the original data is determined by the determining subunit 503 to be not in the encoding range; and encode the original data into the encoded data having the corresponding encoded numerical value included in the codebook and determine the encoded data corresponds to a second sending interval included in the codebook in the case that the original data is determined by the determining subunit 503 to be in the encoding range.

The adjusting unit 502 is configured to make the encoding subunit 501 change the second sending interval to a third sending interval longer than the second sending interval in the case that the amount of original data of which the numerical value is determined by the determining subunit 503 to be maintained in the encoding range exceeds a predetermined first threshold, and then to make the encoding subunit 501 change the third sending interval back to the second sending interval in the case that the amount of original data of which the numerical value is determined by the determining subunit 503 to exceed the encoding range exceeds a predetermined second threshold.

Moreover, as indicated by the dotted box in FIG. 4, according to actual application needs, the source node device 500 in a data processing system according to the fourth embodiment of the present invention may, optionally, further include a codebook generating unit 102 described in the second embodiment, that is, the encoding unit 501 may perform encoding processing by using a prearranged codebook complying with the properties, e.g., described with FIG. 2 and FIG. 3, which shall fall within the spirit and scope of protection of the present invention.

The source node device 500 in a data processing system according to the fourth embodiment of the present invention determines and distinguishes sending intervals of different encoded data based on sending intervals corresponding to the encoded data included in the codebook, thereby achieving at least one of the advantages of: effectively reduced channel load, less channel access collisions, increased energy efficiency of the data processing system, saved resources and extended lifetime of the data processing system. Particularly, the source node device in a data processing system according to the fourth embodiment changes the second sending interval to a third sending interval longer than the second sending interval in the case that the amount of original data of which the numerical value is maintained in the encoding range exceeds a predetermined first threshold and changes the third sending interval back to the second sending interval in the opposite case; hence, the sending interval of the encoded data can be adjusted more flexibly according to actual application needs, thereby further improving energy efficiency of the data processing system and effectively reducing channel load.

Moreover, by changing the second sending interval to a third sending interval longer than the second sending interval in the case that the amount of original data of which the numerical value is maintained in the encoding range exceeds a predetermined first threshold and changing the third sending interval back to the second sending interval in the case that the amount of original data of which the numerical value is determined by the determining subunit to exceed the encoding range exceeds a predetermined second threshold, the source node device 500 in a data processing system according to the fourth embodiment of the present invention can extend or shorten the sending interval flexibly according to the condition of the numerical value of the real-time data in the actual data processing system, thereby further effectively reducing channel load, lessening channel access collisions, increasing energy efficiency of the data processing system, saving resources and extending lifetime of the data processing system.

In addition, it is noted that although the source node device in a data processing system according to the embodiment is described in conjunction with FIG. 5, those skilled in the art will understand that the schematic diagram of FIG. 5 is for illustrative purposes only and should not be considered as limiting the scope of the present invention. Those skilled in the art may make alternations or modifications to the schematic diagram of FIG. 5 according to actual needs.

Moreover, the source node device in a data processing system according to the third embodiment or the fourth embodiment may further include a codebook updating unit for regenerating a updated codebook periodically or in the case that the amount of original data of which the numerical value is determined by the determining subunit to exceed the encoding range exceeds a predetermined third threshold, which shall fall within the spirit and scope of protection of the present invention.

The codebook updating unit above includes a second statistics calculating subunit and a second generating subunit. The second statistics calculating subunit is configured to conduct statistics calculating on original data collected in a predetermined second time window from the current time in a mode of representing global statistical result using local statistics calculating information. The second generating subunit configured to generate the updated codebook according to the statistics calculating result of the second statistics calculating subunit and to inform the encoding unit to use the updated codebook to conduct the encoding processing.

Particularly, by configuring the codebook updating unit above, the sending interval can be extended or shortened flexibly according to the condition of the numerical value of the real-time data in the actual data processing system, thereby further effectively reducing channel load and increasing energy efficiency of the data processing system.

Figure 6:
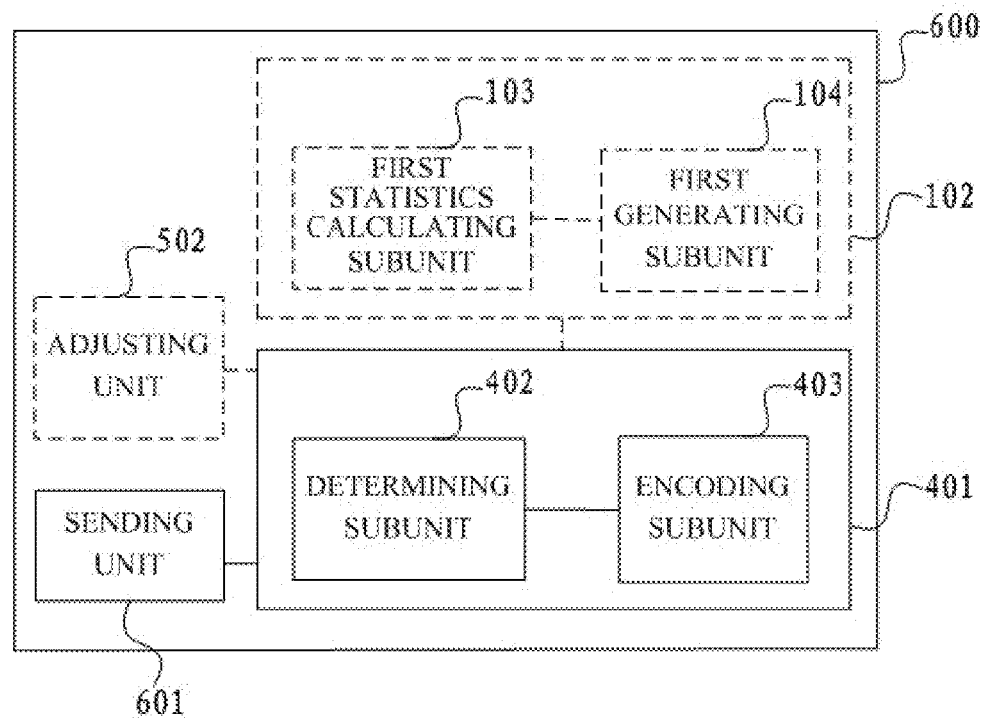
FIG. 6 illustrates a schematic diagram of a source node device in a data processing system according to a fifth embodiment of the invention.

FIG. 6 illustrates a schematic diagram of a source node device in a data processing system according to a fifth embodiment of the invention.

As shown in FIG. 6, the source node device 600 in a data processing system according to the fifth embodiment of the present invention differs from the source node device 400 in a data processing system according to the third embodiment of the present invention in that the source node device 600 includes a sending unit 601 configured to send the encoded data to a destination node device in the data processing system in the sending interval determined by the encoding unit. For the sake of simplicity, descriptions of the same units are omitted here.

The source node device 600 in a data processing system according to the fifth embodiment determines and distinguishes sending intervals of different encoded data based on sending intervals corresponding to the encoded data included in the codebook and sends the corresponding encoded data in the determined sending interval, thereby effectively reducing channel load, lessening channel access collisions, increasing energy efficiency of the data processing system, saving resources and extending lifetime of the data processing system.

Moreover, as indicated by the dotted box in FIG. 6, according to actual application needs, the source node device 600 in a data processing system according to the fifth embodiment of the present invention may, optionally, further include a codebook generating unit 102 described in the second embodiment and/or an adjusting unit described in the fourth embodiment, that is, the encoding unit 501 may perform encoding processing by using a prearranged codebook complying with the properties, e.g., described with FIG. 2 and FIG. 3, and/or may perform adjusting on the sending interval by using an adjusting unit, e.g., described with FIG. 5, both of which shall fall within the spirit and scope of protection of the present invention.

Moreover, as an example, the sending unit is further configured to transmit the codebook or the updated codebook to the destination node device at the time of initialization of the source node device or periodically in the mode of: sending original data corresponding to the encoding range of the codebook or the updated codebook to the destination node device in the first sending interval, and sending the encoded numerical value corresponding to the original data included in the codebook or the updated codebook to the destination node device in the second sending interval.

In the example above, by configuring the sending unit 601 to transmit the codebook or the updated codebook to the destination node device at the time of initialization of the source node device or periodically, synchronization of the codebook between the source node device and the destination node device can be achieved, which may facilitate the subsequent decoding by the destination node device of the received encoded data from the source node device based on the transmitted codebook.

Those skilled in the art will understand that the example above is illustrative but not limitative. Those skilled in the art may, according to actual application needs, flexibly choose to have the source node device transmit the codebook to the destination node device and the timing of the transmission, or preset an agreed codebook in the source node device and the destination node device, both of which shall fall within the spirit and scope of protection of the present invention.

In addition, it is noted that although the source node device in a data processing system according to the embodiment is described in conjunction with FIG. 6, those skilled in the art will understand that the schematic diagram of FIG. 6 is for illustrative purposes only and should not be considered as limiting the scope of the present invention. Those skilled in the art may make alternations or modifications to the schematic diagram of FIG. 6 according to actual needs.

For example, those skilled in the art may make any combination of the component units included in the source node device in a data processing system according to any of the first to fourth embodiments of the present invention, which shall all fall within the spirit and scope of protection of the present invention.

Figure 7:
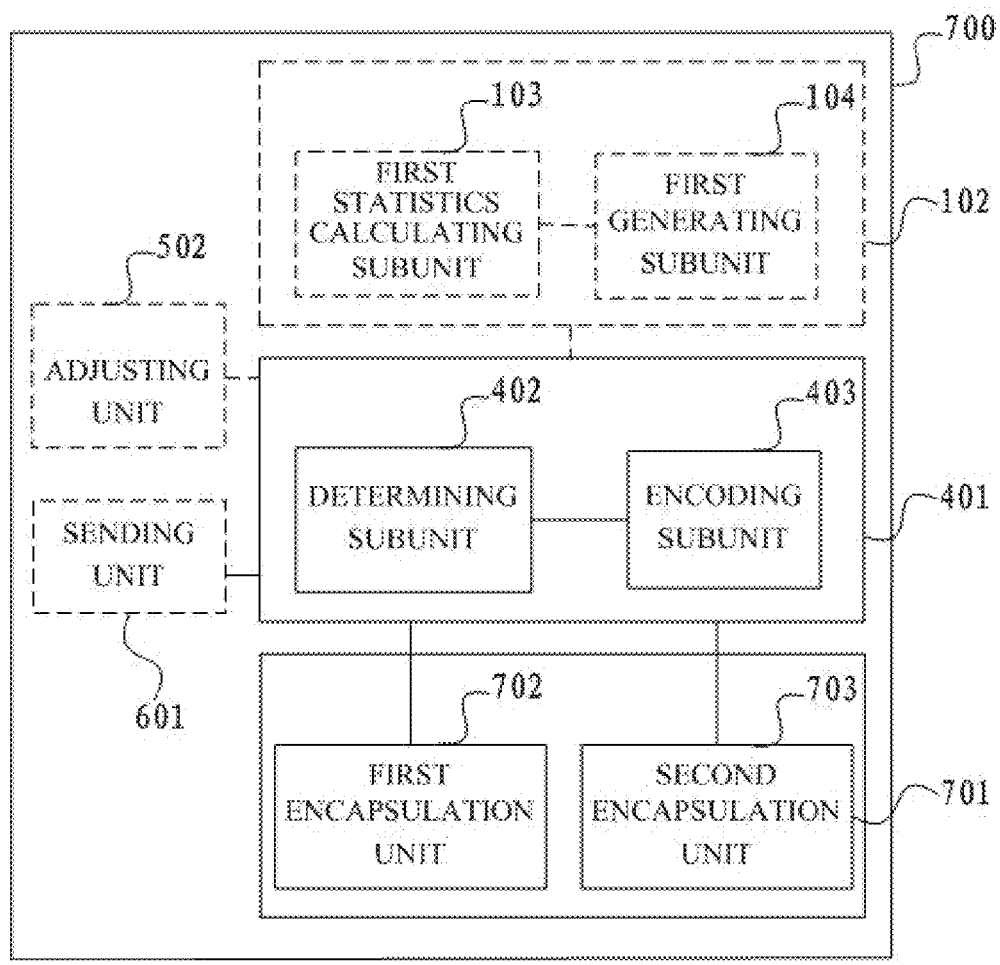
FIG. 7 illustrates a schematic diagram of a source node device in a data processing system according to a sixth embodiment of the invention.

FIG. 7 illustrates a schematic diagram of a source node device in a data processing system according to a sixth embodiment of the invention.

As shown in FIG. 7, the source node device 700 in a data processing system according to the sixth embodiment of the present invention differs from the source node device 400 in a data processing system according to the third embodiment of the present invention in that the source node device 700 includes a first encapsulation unit 701. For the sake of simplicity, descriptions of the same units are omitted here.

In the source node device 700 in a data processing system according to the sixth embodiment of the present invention, the first encapsulation unit 701 is configured to encapsulate the encoded data processed by the encoding unit 501 into a data frame having a predetermined fixed length for transmission.

The first encapsulation unit 701 includes a first encapsulation subunit 702 and a second encapsulation subunit 703.

Figure 8:
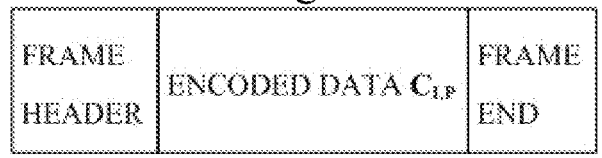
FIG. 8 illustrates a schematic diagram of an encapsulation method used by a first encapsulation unit 702 in a source node device in a data processing system according to a sixth embodiment of the invention.

As shown in FIG. 8, the first encapsulation subunit 702 is configured to encapsulate encoded data corresponding to the original data (i.e., encoded data maintaining the numerical value $C_{i,p}$ of the original data) into the data frame having the predetermined fixed length in the case that the original data is determined by the determining subunit 402 to be not in the encoding range.

Figure 9A:
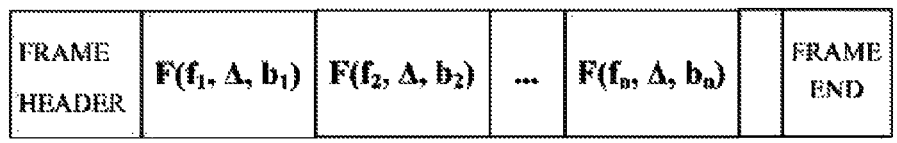
FIG. 9a and FIG. 9b illustrate schematic diagrams of an encapsulation method used by a second encapsulation unit 703 in a source node device in a data processing system according to a sixth embodiment of the invention.
Figure 9B:
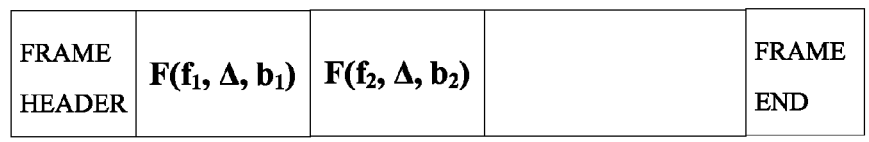

As shown in FIG. 9a and FIG. 9b, the second encapsulation subunit 703 is configured to fill encoded data corresponding to the original data (i.e., $F(f_1, \Delta, b_1), F(f_2, \Delta, b_2), \ldots, F(f_n, \Delta,$ $b_n$) where n is a natural number) sequentially into the data frame having the predetermined fixed length until the length of remainder space of the current data frame is less than the length of the next encoded data to be filled (as shown in FIG. 9a) or until the next encoded data to be filled is encoded data corresponding to original data determined by the determining subunit to be not in the encoding range (as shown in FIG. 9b), in the case that the original data $C_{i,p}$ is determined by the determining subunit 402 to be in the encoding range.

In addition to the results obtainable by the source node device 400 in a data processing system according to the third embodiment of the present invention, particularly, by configuring the first encapsulation unit, the source node device 700 in a data processing system according to the sixth embodiment of the present invention can fill multiple encoded data corresponding to respective original data in the encoding range of the codebook, thereby further reducing network load and increasing energy efficiency of the data processing system.

Moreover, as indicated by the dotted box in FIG. 7, according to actual application needs, the source node device 700 in a data processing system according to the sixth embodiment of the present invention may, optionally, further include a codebook generating unit 102 described in the second embodiment and/or an adjusting unit described in the fourth embodiment and/or a sending unit described in the fifth embodiment, which shall all fall within the spirit and scope of protection of the present invention.

Moreover, as an example, the source node device in a data processing system according to any of the first to the fifth embodiments of the present invention may further include a second encapsulation unit (not shown in the figures). The second encapsulation unit is configured to encapsulate the encoded data processed by the encoding unit respectively into a data frame having an unfixed length in a mode of having no redundant load for transmission. That is, the length of each of the encapsulated and encoded data frames except its frame header and frame end corresponds (e.g., equals) to the length of the encoded data to be encapsulated. Particularly, by encapsulating the encoded data into a data frame having an unfixed length in a mode of having no redundant load, the example can further save system resources.

Those skilled in the art will understand that they may choose, flexibly according to actual application needs, the implementation of the encapsulation unit included in the source node device in a data processing system according to the present invention, which shall all fall within the spirit and scope of protection of the present invention.

In addition, it is noted that although the source node device in a data processing system according to the embodiment is described in conjunction with FIGS. 7-9, those skilled in the art will understand that the schematic diagrams of FIGS. 7-9 are for illustrative purposes only and should not be considered as limiting the scope of the present invention. Those skilled in the art may make alternations or modifications to the schematic diagrams of FIGS. 7-9 according to actual needs.

The destination node device in a data processing system according to a seventh embodiment of the present invention will be described hereinafter.

The destination node device in a data processing system according to a seventh embodiment of the present invention includes a decoding unit (not shown in the figures). The decoding unit is configured to conduct a decoding processing on encoded data from a source node device in the data processing system this time according to a receiving interval or a sending interval between the encoded data from the source node device this time and encoded data from the source node device last time based on a codebook including encoded numerical value and sending interval corresponding to original data, so as to decode the encoded data into original data corresponding to the sending interval and the encoded numerical value included in the codebook. The encoded numerical value and the sending interval included in the codebook are related to the encoded data and the receiving interval, respectively.

The destination node device in a data processing system according to a seventh embodiment of the present invention decodes the received encoded data into the original data corresponding to the sending interval and the encoded numerical value included in the codebook according to the receiving interval or the sending interval between the received encoded data, thereby achieving at least one of the advantages of: effectively reduced channel load, less channel access collisions, increased energy efficiency of the data processing system, saved resources and extended lifetime of the data processing system.

Moreover, as an example, the destination node device may obtain a corresponding sending interval from a receiving interval of received encoded data and an estimated delay, then decode the received encoded data into the original data corresponding to the sending interval and the encoded numerical value included in the codebook.

Moreover, in another example, the destination node device may obtain a corresponding sending interval from a timestamp included in the received encoded data, then decode the received encoded data into the original data corresponding to the sending interval and the encoded numerical value included in the codebook.

Therefore, those skilled in the art will understand that they may choose, flexibly according to actual application needs, from various implementations of the obtaining of the sending interval of the received encoded data, which shall all fall within the spirit and scope of protection of the present invention.

Figure 10:
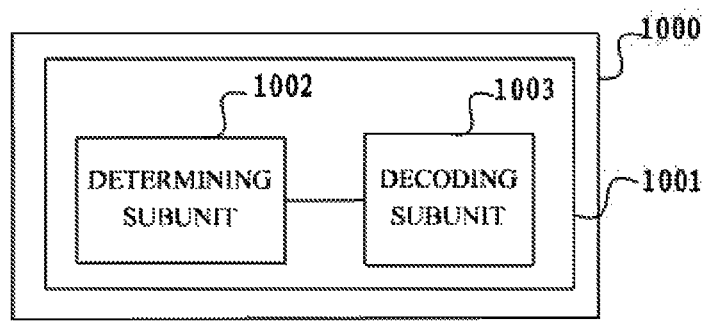
FIG. 10 illustrates a schematic diagram of a destination node device in a data processing system according to an eighth embodiment of the invention.

FIG. 10 illustrates a schematic diagram of a destination node device in a data processing system according to an eighth embodiment of the invention.

As shown in FIG. 10, the destination node device in a data processing system according to an eighth embodiment of the invention includes a decoding unit 1001.

The decoding unit 1001 includes a determining subunit 1002 and a decoding subunit 1003.

The determining subunit 1002 is configured to determine whether the receiving interval or the sending interval corresponds to a first sending interval or a second sending interval included in the codebook.

The decoding subunit 1003 is configured to: take encoded data from the source node device as the original data in the case that the receiving interval or the sending interval is determined by the determining subunit 1002 to be corresponding to the first sending interval, and look up the codebook to obtain original data corresponding to the encoded data from the source node device and the second sending interval in the case that the receiving interval or the sending interval is determined by the determining subunit 1002 to be corresponding to the second sending interval.

The destination node device in a data processing system according to the eighth embodiment of the present invention decodes the received encoded data into the original data corresponding to the sending interval and the encoded numerical value included in the codebook according to the receiving interval or the sending interval between the received encoded data, thereby achieving at least one of the advantages of: effectively reduced channel load, less channel access collisions, increased energy efficiency of the data processing system, saved resources and extended lifetime of the data processing system. Particularly, the destination node device in a data processing system according to the eighth embodiment of the present invention determines whether the receiving interval or the sending interval corresponds to a first sending interval or a second sending interval included in the codebook by a determining subunit and determines the original data corresponding to the encoded data and the sending interval based on the codebook according to the determining result, so that the corresponding original data can be determined from the encoded data and the sending interval more efficiently, thereby further improving processing efficiency.

In addition, it is noted that although the source node device in a data processing system according to the embodiment is described in conjunction with FIG. 10, those skilled in the art will understand that the schematic diagram of FIG. 10 is for illustrative purposes only and should not be considered as limiting the scope of the present invention. Those skilled in the art may make alternations or modifications to the schematic diagram of FIG. 10 according to actual needs.

Figure 11:
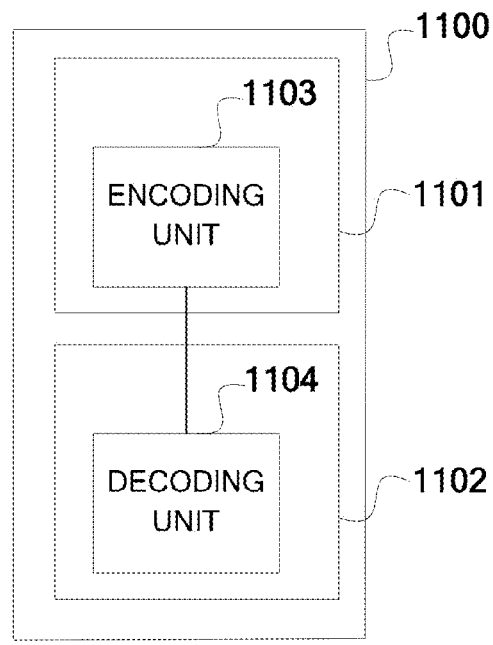
FIG. 11 illustrates a schematic diagram of a data processing system according to a ninth embodiment of the invention.

FIG. 11 illustrates a schematic diagram of a data processing system according to a ninth embodiment of the invention.

As shown in FIG. 11, the data processing system 1100 according to the ninth embodiment of the invention includes a source node device 1101 and a destination node device 1102, which makes original data be encoded into encoded data at the source node device 1101 and transmitted to the destination node device 1102 and the destination node device 1102 conduct decoding processing on the received encoded data to obtain the original data.

The source node device 1101 includes an encoding unit 1103. The encoding unit 1103 is configured to conduct an encoding processing on collected original data according to a codebook including a encoded numerical value and a sending interval which are corresponding to the original data so as to encode the original data into encoded data having a corresponding encoded numerical value included in the codebook, and to determine a sending interval corresponding to the encoded data included in the codebook.

The destination node device 1102 includes a decoding unit 1104. The decoding unit 1104 is configured to conduct a decoding processing on encoded data from the source node device 1101 this time according to a receiving interval or a sending interval between the encoded data from the source node device 1101 this time and encoded data from the source node device 1101 last time based on a codebook including encoded numerical value and sending interval corresponding to original data, so as to decode the encoded data into original data corresponding to the sending interval and the encoded numerical value included in the codebook. The encoded numerical value and the sending interval included in the codebook are related to the encoded data and the receiving interval, respectively.

In the data processing system according to the eighth embodiment of the invention, the source node device determines and distinguishes sending intervals of different encoded data based on sending intervals corresponding to the encoded data included in the codebook, and the destination node device decodes the received encoded data into the original data corresponding to the sending interval and the encoded numerical value included in the codebook according to the receiving interval or the sending interval between the received encoded data, thereby achieving at least one of the advantages of: effectively reduced channel load, less channel access collisions, increased energy efficiency of the data processing system, saved resources and extended lifetime of the data processing system.

In addition, it is noted that although the source node device in a data processing system according to the embodiment is described in conjunction with FIG. 11, those skilled in the art will understand that the schematic diagram of FIG. 11 is for illustrative purposes only and should not be considered as limiting the scope of the present invention. Those skilled in the art may make alternations or modifications to the schematic diagram of FIG. 11 according to actual needs.

For example, the source node device 1101 and the destination node device 1102 in the data processing system 1100 according to the present invention may be implemented with the source node device in a data processing system described in any of the first to sixth embodiments of the present invention and the destination node device in a data processing system described in any of the seventh to eighth embodiments of the present invention, which shall all fall within the spirit and scope of protection of the present invention.

As an example, the data processing system according to the present invention may be a star WSN system or a peer-to-peer WSN system.

Figure 12:
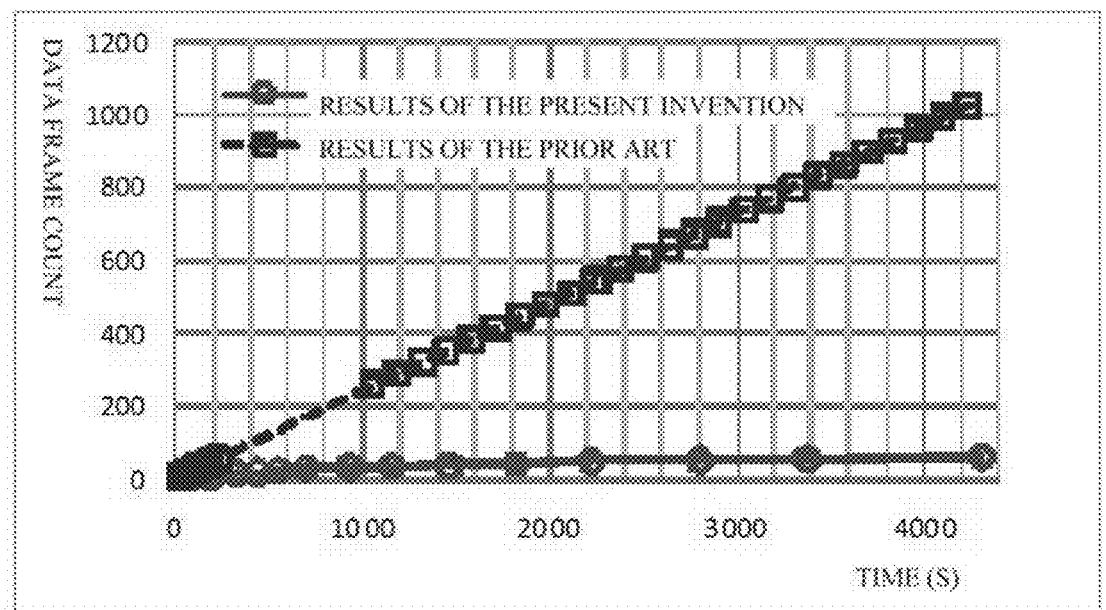
FIG. 12 illustrates a schematic diagram of the comparison of results on data frame count between a data processing system according to an embodiment of the invention and the prior art.
Figure 13:
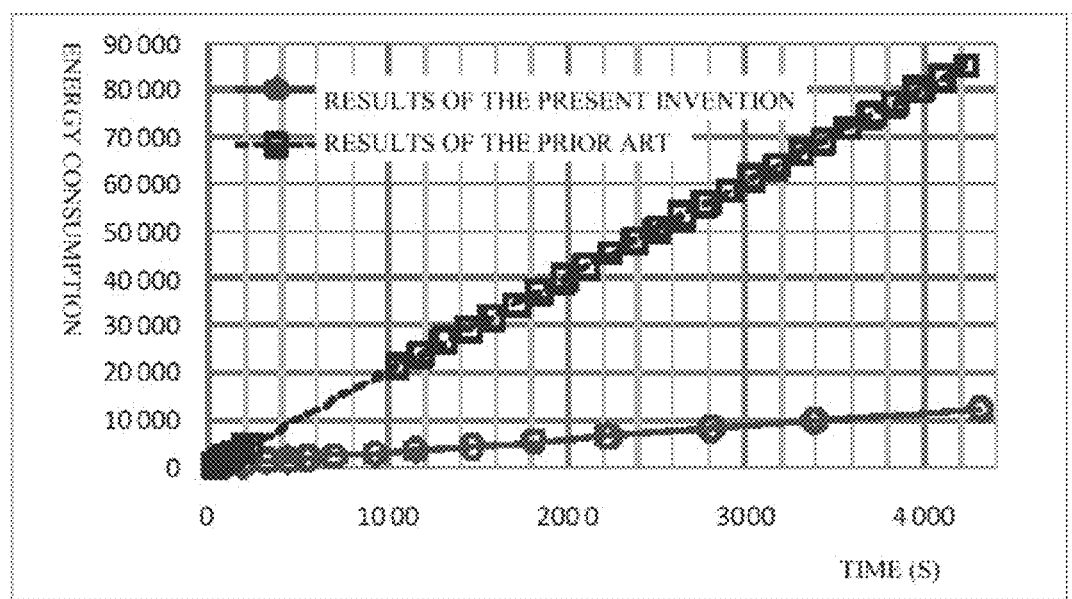
FIG. 13 illustrates a schematic diagram of the comparison of results on energy efficiency between a data processing system according to an embodiment of the invention and the prior art.

FIG. 12 and FIG. 13 illustrate schematic diagrams of the comparison of results on data frame count and energy efficiency between a data processing system according to an embodiment of the invention and the prior art.

As shown in FIG. 12, the data frame count of the data processing system according to an embodiment of the invention is significantly lower than the prior art.

As shown in FIG. 13, the energy consumption of the data processing system according to an embodiment of the invention is significantly lower than the prior art.

A method of data encoding according to a tenth embodiment of the present invention will be described hereinafter. The method of data encoding according to the tenth embodiment of the present invention includes: conducting an encoding processing on collected original data according to a codebook including a encoded numerical value and a sending interval which are corresponding to the original data so as to encode the original data to encoded data having a corresponding encoded numerical value included in the codebook, and determining a sending interval corresponding to the encoded data included in the codebook. Those skilled in the art will understand that the method of data encoding according to the tenth embodiment of the present invention may be implemented with, e.g., the source node device in a data processing system described in any of the first to sixth embodiments of the present invention, which shall all fall within the spirit and scope of protection of the present invention. The details are omitted here.

A method of data encoding according to an eleventh embodiment of the present invention will be described hereinafter. The method of data encoding according to the eleventh embodiment of the present invention includes: conducting a decoding processing on encoded data from a source node device in the data processing system this time according to receiving interval or sending interval between the encoded data from the source node device this time and encoded data from the source node device last time based on a codebook including encoded numerical value and sending interval corresponding to original data, so as to decode the encoded data into original data corresponding to the sending interval and the encoded numerical value included in the codebook, wherein the encoded numerical value and the sending interval included in the codebook are related to the encoded data and the receiving interval, respectively. Those skilled in the art will understand that the method of data encoding according to the eleventh embodiment of the present invention may be implemented with, e.g., the destination node device in a data processing system described in any of the seventh to eighth embodiments of the present invention, which shall all fall within the spirit and scope of protection of the present invention. The details are omitted here.

Figure 14:
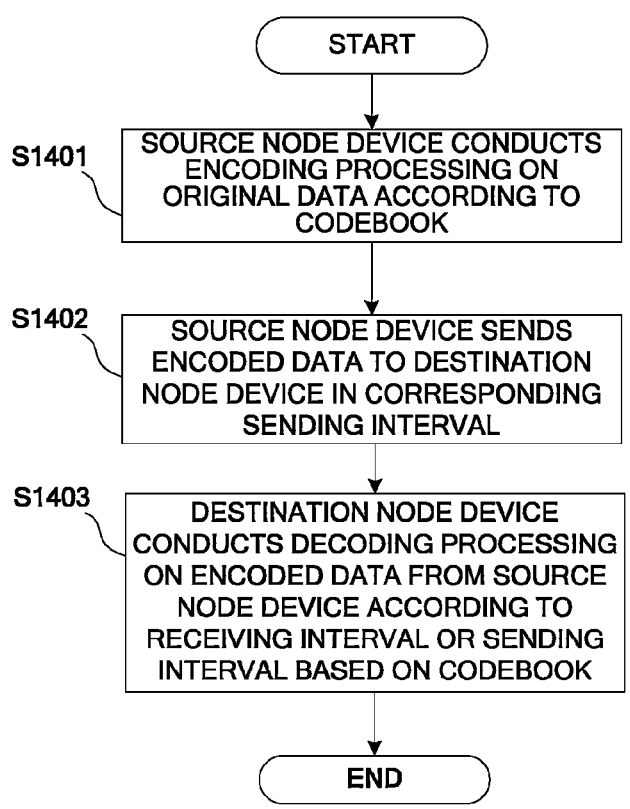
FIG. 14 illustrates a flow chart of a data processing method according to a twelfth embodiment of the invention.

FIG. 14 illustrates a flow chart of a data processing method according to a twelfth embodiment of the invention.

The data processing method according to the twelfth embodiment of the invention starts at step S1401. In step S1401, a source node device conducts an encoding processing on collected original data according to a codebook including a encoded numerical value and a sending interval which are corresponding to the original data so as to encode the original data to encoded data having a corresponding encoded numerical value included in the codebook, and determine a sending interval corresponding to the encoded data included in the codebook.

Then, in step S1402, the source node device sends the encoded data to a destination node device in the determined corresponding sending interval.

Then, in step S1403, the destination node device conducts a decoding processing on encoded data from a source node device in the data processing system this time according to receiving interval or sending interval between the encoded data from the source node device this time and encoded data from the source node device last time based on a codebook including encoded numerical value and sending interval corresponding to original data, so as to decode the encoded data into original data corresponding to the sending interval and the encoded numerical value included in the codebook. The encoded numerical value and the sending interval included in the codebook are related to the encoded data and the receiving interval, respectively In the data processing method according to the twelfth embodiment of the invention, the source node device determines and distinguishes sending intervals of different encoded data based on sending intervals corresponding to the encoded data included in the codebook, and the destination node device decodes the received encoded data into the original data corresponding to the sending interval and the encoded numerical value included in the codebook according to the receiving interval or the sending interval between the received encoded data, thereby achieving at least one of the advantages of: effectively reduced channel load, less channel access collisions, increased energy efficiency of the data processing system, saved resources and extended lifetime of the data processing system.

In addition, it is noted that although the data processing method according to the embodiment is described in conjunction with the flow chart of FIG. 14, those skilled in the art will understand that the flow chart of FIG. 14 is for illustrative purposes only and should not be considered as limiting the scope of the present invention. Those skilled in the art may make alternations or modifications to the flow chart of FIG. 14 according to actual needs.

Figure 15:
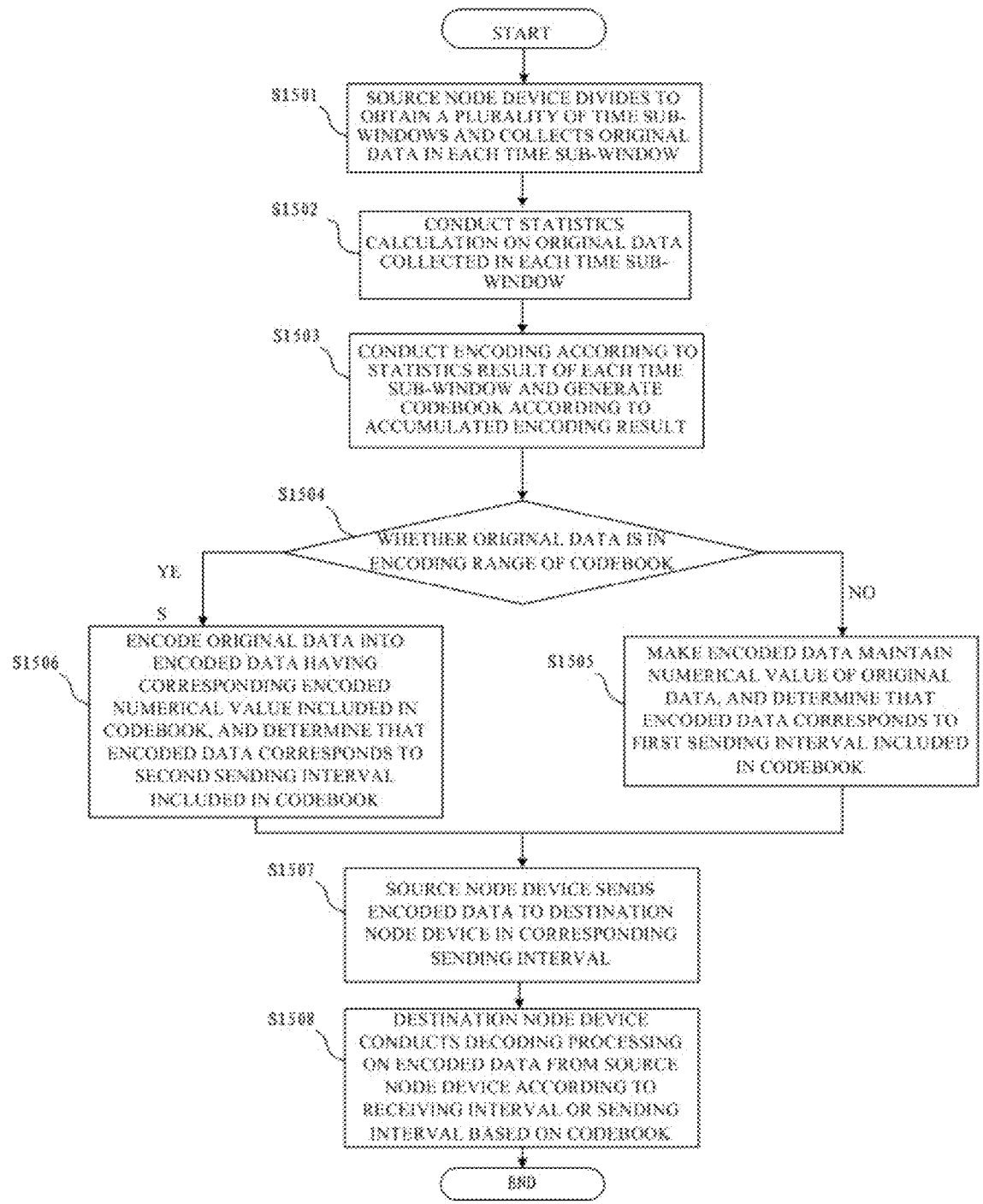
FIG. 15 illustrates a flow chart of an example of a data processing method according to an embodiment of the invention.

For example, in an example of the data processing method according to the present invention as shown in FIG. 15, firstly in step S1501, a source node device of a WSN system divides a predetermined time window into a plurality of time sub-windows and collects original data in each time sub-window.

Then, in step S1502, the source node device conducts statistics calculating on the original data collected in each time sub-window to obtain a statistics calculating result for each time sub-window.

Then, in step S1503, the source node device conducts encoding according to the statistics calculating result of each time sub-window respectively, and generates a codebook including an encoded numerical value and a sending interval which are corresponding to the original data according to accumulated encoding result for each time sub-window.

Then, in steps S1504-S1506, the source node device conducts an encoding processing on original data that are collected subsequently, to encode the original data into encoded data having a corresponding encoded numerical value included in the codebook.

Specifically, in step S1504, the source node device determines whether the original data is in an encoding range of the codebook.

Then, in the case that it is determined in step S1504 that the original data is not in the encoding range, in step S1505 the encoded data is made to maintain the numerical value of the original data and the encoded data is determined to correspond to a first sending interval included in the codebook. In the case that it is determined in step S1504 that the original data is in the encoding range, in step S1506 the original data is encoded into the encoded data having the corresponding encoded numerical value included in the codebook and the encoded data is determined to correspond to a second sending interval included in the codebook.

Then, in step S1507, the source node device sends the encoded data to a destination node device in the determined sending interval.

Then, in step 1508, the destination node device conducts a decoding processing on encoded data from a source node device in the data processing system this time according to a receiving interval or a sending interval between the encoded data from the source node device this time and encoded data from the source node device last time based on a codebook including encoded numerical value and sending interval corresponding to original data, so as to decode the encoded data into original data corresponding to the sending interval and the encoded numerical value included in the codebook. The encoded numerical value and the sending interval included in the codebook are related to the encoded data and the receiving interval, respectively.

Similarly, although the data processing method according to the embodiment is described in conjunction with the flow chart of FIG. 15, those skilled in the art will understand that the flow chart of FIG. 15 is for illustrative purposes only and should not be considered as limiting the scope of the present invention. Those skilled in the art may make alternations or modifications to the flow chart of FIG. 15 according to actual needs.

The present invention and its advantages have described above, however, it will be appreciated that various variations, alternations and modifications may be made without deviation from the sprit and scope of the present invention defined by the attached claims.

Furthermore, the method and device according to the present invention may be implemented with hardware, or may be implemented with software and firmware. In case of implementing them by software or firmware, a program constituting the software may be installed into a computer with dedicated hardware, for example, a general-purpose personal computer 1600 as shown in FIG. 16 from a storage medium or a network, and the computer is capable of performing various functions if with various programs installed therein.

Figure 16:
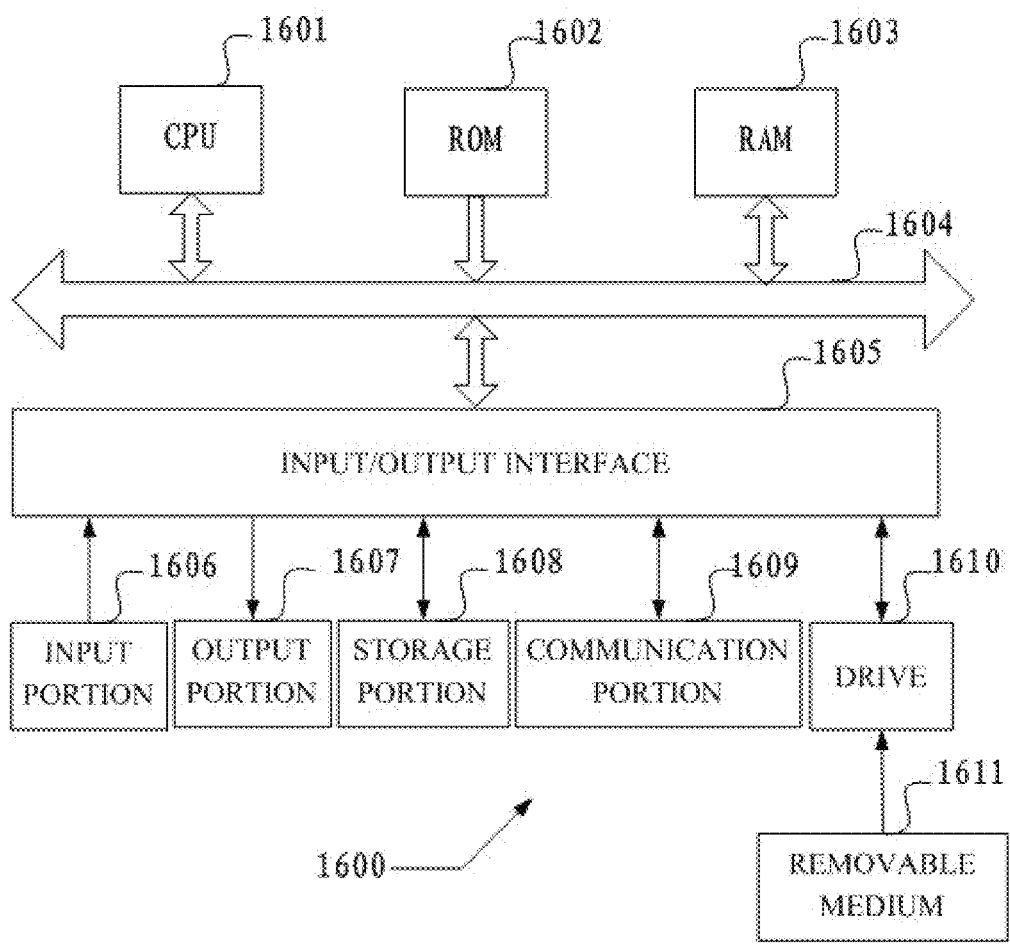
FIG. 16 illustrates a schematic diagram of a general-purpose computer used in the case where the method and the device of the present invention are implemented with software and firmware.

In FIG. 16, a Central Processing Unit (CPU) 1601 performs various processes based on a program stored in a Read Only Memory (ROM) 1602 or a program loaded from a storage section 1608 to a Random Access Memory (RAM)

1603. In the RAM 1603, data necessary when the CPU 1601 performs the various processes or the like is also stored as necessary. CPU 1601, ROM 1602 and RAM 1603 are interconnected via a bus 1304. An input/output interface 1605 is also connected to the bus 1604. And the following components are connected to the input/output interface 1605: an input portion 1606 such as keyboard and mouse; an output portion 1607 such as display, e.g., Cathode Ray Tube (CRT) and Liquid Crystal Display (LCD), and speaker; a storage portion 16087 such as hard disk; and a communication portion 1609 such as network interface card, e.g., LAN card, and modem. The communication portion 1609 performs communication processing via a network such as the Internet.

A drive 610 may also be connected to the input/output interface 1605 as necessary. A removable medium 1611, such as a magnetic disk, an optical disk, a magneto-optical disk, a semiconductor memory, or the like, is loaded on the drive 610 as necessary, so that a computer program read there from may be installed into the storage section 608 as necessary.

In the case where the above-described series of processes is implemented with software, the program that constitutes the software may be installed from a network such as the Internet or a storage medium such as the removable medium 1611.

Those skilled in the art would appreciate that, the storage medium is not limited to the removable medium 1611 having the program stored therein as illustrated in FIG. 16, which is delivered separately from the device for providing the program to the user. Examples of the removable medium 1611 include a magnetic disk (including a Floppy Disk™), an optical disk (including a Compact Disk-Read Only Memory (CD-ROM) and a Digital Versatile Disk (DVD)), a magneto-optical disk (including a Mini-Disk (MD™)), and a semiconductor memory. Alternatively, the storage medium may be the ROM 1602, the hard disk contained in the storage section 1608, or the like, which has the program stores therein and is delivered to the user together with the device that contains them.

Thus, as long as the system or the device has the function to execute the program, the embodiments of the present invention are not limited to the program, and the program may also in any form, for example, an object program, a program run under an interpreter, or a script program provided to an operating system.

In addition, the present invention may be implemented by a computer connecting to a corresponding website on the Internet, downloading and installing computer program code of the present invention to the computer, and then executing the program.

Moreover, the program implementing the present invention may in the form of one or more signals. The signal may be a data signal downloaded from a Internet website, or a data signal provided on a carrier signal, or a data signal in any other form.

Finally, it is noted that, in the specification the relational terms such as first and second are merely used to distinguish one entity or operation from another entity or operation, which do not necessarily require or suggest any actual relation or sequence between the entities or operations. Moreover, the terms "include", "comprise", or any other variation used herein are inclusive, do not exclude unrecited elements of a process, method, product or device including a series of elements, and do not exclude inherent elements of the process, method, product or device. Moreover, if no more restrictions are binding, the phrase such as "including an element" does not exclude the case where more of the elements are present in the process, method, product or device including the element.

With respect to the implementations of the embodiments above, the following appendix is disclosed:

Appendix

Appendix 1. A source node device in a data processing system, comprising:

an encoding unit configured to conduct an encoding processing on collected original data according to a codebook comprising a encoded numerical value and a sending interval which are corresponding to the original data so as to encode the original data into encoded data having a corresponding encoded numerical value comprised in the codebook, and to determine a sending interval corresponding to the encoded data comprised in the codebook.

Appendix 2. The source node device according to appendix 1, further comprising a codebook generating unit for generating the codebook in advance, wherein the codebook comprises:

a first statistics calculating subunit configured to conduct statistics calculating on original data gathered in a predetermined time window before the collected original data in a mode of representing a global statistics calculating result using local statistics calculating information; and a first generating subunit configured to generate the codebook according to the statistics calculating result of the statistics calculating subunit.

Appendix 3. The source node device of appendix 2, wherein:

the first statistics calculating subunit is configured to divide the predetermined first time window into a plurality of time sub-windows and conduct statistics calculating on original data gathered in each time sub-window respectively to obtain a statistics calculating result for each time sub-window; and the first generating subunit is configured to conduct encoding according to the statistics calculating result of each time sub-window respectively and generate the codebook according to accumulated encoding result for each time sub-window.

Appendix 4. The source node device according to Appendix 3, wherein:

the first generating subunit generates the codebook in a mode of variable length coding.

Appendix 5. The source node device according to any one of Appendixes 1-3, wherein the encoding unit comprises:

a determining subunit configured to determine whether the original data is in an encoding range of the codebook; and an encoding subunit configured to:

make the encoded data maintain the numerical value of the original data and determine that the encoded data corresponds to a first sending interval comprised in the codebook in the case that the original data is determined by the determining subunit to be not in the encoding range; and encode the original data into the encoded data having the corresponding encoded numerical value comprised in the codebook and determine that the encoded data corresponds to a second sending interval comprised in the codebook in the case that the original data is determined by the determining subunit to be in the encoding range.

Appendix 6. The source node device according to appendix 5, further comprising:

an adjusting unit configured to make the encoding subunit change the second sending interval to a third sending interval longer than the second sending interval in the case that the amount of original data of which the numerical value is determined by the determining subunit to be maintained in the encoding range exceeds a predetermined first threshold, and then to make the encoding subunit change the third sending interval back to the second sending interval in the case that the amount of original data of which the numerical value is determined by the determining subunit to exceed the encoding range exceeds a predetermined second threshold.

Appendix 7. The source node device according to appendix 5, further comprising a codebook updating unit for regenerate a updated codebook periodically or in the case that the amount of original data of which the numerical value is determined by the determining subunit to exceed the encoding range exceeds a predetermined third threshold, the codebook updating unit comprising:

a second statistics calculating subunit configured to, periodically or in the case that the amount of original data of which the numerical value is determined by the determining subunit to exceed the encoding range exceeds the predetermined third threshold, conduct statistics calculating on original data gathered in a predetermined second time window from the current time in a mode of representing global statistical result using local statistics calculating information; and a second generating subunit configured to generate the updated codebook according to the statistics calculating result of the second statistics calculating subunit and to inform the encoding unit to use the updated codebook to conduct the encoding processing.

Appendix 8. The source node device according to any one of appendixes 1-7, further comprising:

a sending unit configured to send the encoded data to a destination node device in the data processing system in the sending interval determined by the encoding unit.

Appendix 9. The source node device according to appendix 8, wherein the sending unit is further configured to transmit the codebook and the updated codebook to the destination node device at the time of initialization of the source node device or periodically in the mode of:

sending original data corresponding to the encoding range of the codebook or the updated codebook to the destination node device in the first sending interval, and sending the encoded numerical value corresponding to the original data and comprised in the codebook or the updated codebook to the destination node device in the second sending interval.

Appendix 10. The source node device according to any of appendixes 5-9, further comprising:

a first encapsulation unit configured to encapsulate the encoded data processed by the encoding unit into a data frame having a predetermined fixed length for transmission, wherein the first encapsulation unit comprises:

a first encapsulation subunit configured to, in the case that original data is determined by the determining subunit to be not in the encoding range, encapsulate encoded data corresponding to the original data into the data frame having the predetermined fixed length, and a second encapsulation subunit configured to, in the case that original data is determined by the determining subunit to be in the encoding range fill encoded data corresponding to the original data sequentially into the data frame having the predetermined fixed length until the length of remainder space of the current data frame is less than the length of the next encoded data to be filled or until the next encoded data to be filled is encoded data corresponding to original data determined by the determining subunit to be not in the encoding range.

Appendix 11. The source node device according to any of appendixes 1-9, further comprising:

a second encapsulation unit configured to encapsulate the encoded data processed by the encoding unit respectively into a data frame having a unfixed length in a mode of having no redundant load for transmission.

Appendix 12. A destination node device in a data processing system, comprising:

a decoding unit configured to conduct a decoding processing on encoded data from a source node device in the data processing system this time according to receiving interval or sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

Appendix 13. The destination node device according to appendix 12, wherein the decoding unit comprises:

a determining subunit configured to determine whether the receiving interval or the sending interval corresponds to a first sending interval or a second sending interval comprised in the codebook;

a decoding subunit configured to:
take encoded data from the source node device as the original data in the case that the receiving interval or the sending interval is determined by the determining subunit to be corresponding to the first sending interval, and
look up the codebook to obtain original data corresponding to the encoded data from the source node device and the second sending interval in the case that the receiving interval or the sending interval is determined by the determining subunit to be corresponding to the second sending interval.

Appendix 14. A data processing system comprising a source node device according to any of appendixes 1-11 and a destination node device according to any of appendixes 12-13 which makes original data be encoded into encoded data at the source node device and transmitted to the destination node device and the destination node device conduct decoding processing on the received encoded data to obtain the original data.

Appendix 15. The data processing system according to appendix 14, wherein the data processing system is a star-shaped wireless sensor network system or a peer-to-peer wireless sensor network system.

Appendix 16. A method of data encoding, comprising:

conducting an encoding processing on collected original data according to a codebook comprising a encoded numerical value and a sending interval which are corresponding to the original data so as to encode the original data to encoded data having a corresponding encoded numerical value comprised in the codebook, and determining a sending interval corresponding to the encoded data comprised in the codebook.

Appendix 17. A method of data decoding, comprising:

conducting a decoding processing on encoded data from a source node device in the data processing system this time according to receiving interval or sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

Appendix 18. A method of data processing, comprising:

conducting an encoding processing, by a source node device, on collected original data according to a codebook comprising a encoded numerical value and a sending interval which are corresponding to the original data so as to encode the original data to encoded data having a corresponding encoded numerical value comprised in the codebook, and determine a sending interval corresponding to the encoded data comprised in the codebook;

sending, by the source node device, the encoded data to a destination node device in the determined corresponding sending interval; and conducting, by the destination node device, a decoding processing on encoded data from a source node device in the data processing system this time according to receiving interval or sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

Preferred embodiments of the present invention are described above in conjunction with the accompanying drawings. It will be appreciated that the embodiment described above are for illustrative purposes only and should not be considered as limiting the scope of the present invention. Those skilled in the art may make various modifications and alternations without deviation from the spirit and the principle of the present invention. Therefore, the scope of the present invention shall be defined by the attached claims and its equivalent.

What is claimed is:

1. A source node device in a data processing system, comprising:
   an encoding unit, configured to conduct an encoding processing on collected original data according to a codebook comprising an encoded numerical value and a sending interval which are corresponding to the original data so as to encode the original data into encoded data having a corresponding encoded numerical value comprised in the codebook, and to determine a sending interval corresponding to the encoded data comprised in the codebook, wherein the encoding unit comprises:
   a determining subunit, configured to determine whether the original data is in an encoding range of the codebook; and
   an encoding subunit configured to:
      make the encoded data maintain the numerical value of the original data and determine that the encoded data corresponds to a first sending interval comprised in the codebook in the case that the original data is determined by the determining subunit to be not in the encoding range; and
      encode the original data into the encoded data having the corresponding encoded numerical value comprised in the codebook and determine that the encoded data corresponds to a second sending interval comprised in the codebook in the case that the original data is determined by the determining subunit to be in the encoding range; and
   a sending unit, configured to send the encoded data to a destination node device in the data processing system in the sending interval determined by the encoding unit.

2. The source node device according to claim 1, further comprising a codebook generating unit for generating the codebook in advance, wherein the codebook generating unit comprises:
   a first statistics calculating subunit, configured to conduct statistics calculating on original data gathered in a predetermined time window before the collected original data in a mode of representing a global statistics calculating result using local statistics calculating information; and
   a first generating subunit, configured to generate the codebook according to the statistics calculating result of the statistics calculating subunit.

3. The source node device of claim 2, wherein:
   the first statistics calculating subunit is configured to divide the predetermined first time window into a plurality of time sub-windows and conduct statistics calculating on original data gathered in each time sub-window respectively to obtain a statistics calculating result for each time sub-window; and
   the first generating subunit is configured to conduct encoding according to the statistics calculating result of each time sub-window respectively and generate the codebook according to accumulated encoding result for each time sub-window.

4. The source node device according to claim 3, wherein:
   the first generating subunit generates the codebook in a mode of variable length coding.

5. The source node device according to claim 1, further comprising:
   an adjusting unit, configured to make the encoding subunit change the second sending interval to a third sending interval longer than the second sending interval in the case that the amount of original data of which the numerical value is determined by the determining subunit to be maintained in the encoding range exceeds a predetermined first threshold, and then to make the encoding subunit change the third sending interval back to the second sending interval in the case that the amount of original data of which the numerical value is determined by the determining subunit to exceed the encoding range exceeds a predetermined second threshold.

6. The source node device according to claim 1, further comprising a codebook updating unit for regenerating a updated codebook periodically or in the case that the amount of original data of which the numerical value is determined by the determining subunit to exceed the encoding range exceeds a predetermined third threshold, wherein the codebook updating unit comprises:
   a second statistics calculating subunit, configured to, periodically or in the case that the amount of original data of which the numerical value is determined by the determining subunit to exceed the encoding range exceeds the predetermined third threshold, conduct statistics calculating on original data collected in a predetermined second time window from the current time in a mode of representing a global statistical result using local statistics calculating information; and
   a second generating subunit, configured to generate the updated codebook according to the statistics calculating result of the second statistics calculating subunit and to inform the encoding unit to use the updated codebook to conduct the encoding processing.

7. The source node device according to claim 1, wherein the sending unit is further configured to transmit the codebook or the updated codebook to the destination node device at the time of initialization of the source node device or periodically in the mode of:

sending original data corresponding to the encoding range of the codebook or the updated codebook to the destination node device in the first sending interval, and sending the encoded numerical value corresponding to the original data and comprised in the codebook or the updated codebook to the destination node device in the second sending interval.

8. The source node device according to claim 1, further comprising:

a fixed length data frame encapsulation unit, configured to encapsulate the encoded data processed by the encoding unit into a data frame having a predetermined fixed length for transmission, wherein the fixed length data frame encapsulation unit comprises:

a first encapsulation subunit, configured to, in the case that original data is determined by the determining subunit to be not in the encoding range, encapsulate encoded data corresponding to the original data into the data frame having the predetermined fixed length, and a second encapsulation subunit, configured to, in the case that original data is determined by the determining subunit to be in the encoding range, fill encoded data corresponding to the original data sequentially into the data frame having the predetermined fixed length until the length of remainder space of the current data frame is less than the length of the next encoded data to be filled or until the next encoded data to be filled is encoded data corresponding to original data determined by the determining subunit to be not in the encoding range.

9. The source node device according to claim 1, further comprising:

an unfixed length data frame encapsulation unit configured to encapsulate the encoded data processed by the encoding unit respectively into a data frame having a unfixed length in a mode of having no redundant load for transmission.

10. A destination node device in a data processing system for decoding encoded data from the source node device according to claim 1 in the data processing system, comprising:

a decoding unit, configured to conduct a decoding processing on encoded data from the source node device this time according to a receiving interval or a sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

11. The destination node device according to claim 10, wherein the decoding unit comprises:

a determining subunit, configured to determine whether the receiving interval or the sending interval corresponds to a first sending interval or a second sending interval comprised in the codebook;

a decoding subunit, configured to:

take encoded data from the source node device as the original data in the case that the receiving interval or the sending interval is determined by the determining subunit to be corresponding to the first sending interval, and look up the codebook to obtain original data corresponding to the encoded data from the source node device and the second sending interval in the case that the receiving interval or the sending interval is determined by the determining subunit to be corresponding to the second sending interval.

12. A data processing system comprising a source node device and a destination node device which makes original data be encoded into encoded data at the source node device and transmitted to the destination node device, and the destination node device conduct decoding processing on the received encoded data to obtain the original data, wherein the source node device comprises: an encoding unit, configured to conduct an encoding processing on collected original data according to a codebook comprising an encoded numerical value and a sending interval which are corresponding to the original data so as to encode the original data into encoded data having a corresponding encoded numerical value comprised in the codebook, and to determine a sending interval corresponding to the encoded data comprised in the codebook, wherein the encoding unit comprises:

a determining subunit, configured to determine whether the original data is in an encoding range of the codebook; and an encoding subunit configured to:

make the encoded data maintain the numerical value of the original data and determine that the encoded data corresponds to a first sending interval comprised in the codebook in the case that the original data is determined by the determining subunit to be not in the encoding range; and encode the original data into the encoded data having the corresponding encoded numerical value comprised in the codebook and determine that the encoded data corresponds to a second sending interval comprised in the codebook in the case that the original data is determined by the determining subunit to be in the encoding range; and a sending unit, configured to send the encoded data to a destination node device in the data processing system in the sending interval determined by the encoding unit; and the destination node device comprises: a decoding unit, configured to conduct the decoding processing on encoded data from the source node device in the data processing system this time according to a receiving interval or a sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

13. The data processing system according to claim 12, wherein the data processing system is a star-shaped wireless sensor network system or a peer-to-peer wireless sensor network system.

14. A method of data encoding, comprising:
conducting an encoding processing, by an encoding unit, on collected original data according to a codebook comprising a encoded numerical value and a sending interval which are corresponding to the original data so as to encode the original data to encoded data having a corresponding encoded numerical value comprised in the codebook, and determining a sending interval corresponding to the encoded data comprised in the codebook, comprising, determining, by a determining subunit, whether the original data is in an encoding range of the codebook;

making, by a encoding subunit, the encoded data maintain the numerical value of the original data and determining by the encoding subunit that the encoded data corresponds to a first sending interval comprised in the codebook in the case that the original data is determined by the determining subunit to be not in the encoding range; and encoding, by the encoding subunit, the original data into the encoded data having the corresponding encoded numerical value comprised in the codebook and determining, by the encoding subunit, that the encoded data corresponds to a second sending interval comprised in the codebook in the case that the original data is determined by the determining subunit to be in the encoding range; and sending, by the sending unit, the encoded data to a destination node device in the data processing system in the sending interval determined by the encoding unit.

15. A method of data decoding for decoding encoded data from the source node device according to claim 1 in a data processing system, comprising:

conducting a decoding processing, by a decoding unit, on the encoded data from the source node device this time according to receiving interval or sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

16. A method of data processing, comprising:
conducting an encoding processing, by a source node device, on collected original data according to a codebook comprising a encoded numerical value and a sending interval which are corresponding to the original data so as to encode the original data to encoded data having a corresponding encoded numerical value comprised in the codebook, and determine a sending interval corresponding to the encoded data comprised in the codebook, comprising, determining, by a determining subunit, whether the original data is in an encoding range of the codebook;

making, by a encoding subunit, the encoded data maintain the numerical value of the original data and determining by the encoding subunit that the encoded data corresponds to a first sending interval comprised in the codebook in the case that the original data is determined by the determining subunit to be not in the encoding range; and encoding, by the encoding subunit, the original data into the encoded data having the corresponding encoded numerical value comprised in the codebook and determining, by the encoding subunit, that the encoded data corresponds to a second sending interval comprised in the codebook in the case that the original data is determined by the determining subunit to be in the encoding range;

sending, by the source node device, the encoded data to a destination node device in the determined corresponding sending interval; and conducting, by the destination node device, a decoding processing on encoded data from a source node device in the data processing system this time according to receiving interval or sending interval between the encoded data from the source node device this time and encoded data from the source node device last time based on a codebook comprising an encoded numerical value and a sending interval which are corresponding to original data, so as to decode the encoded data of this time into the original data corresponding to the sending interval and the encoded numerical value comprised in the codebook, wherein the encoded numerical value and the sending interval comprised in the codebook are related to the encoded data and the receiving interval, respectively.

* * * * *